United States Patent
Speier et al.

(10) Patent No.: US 10,541,044 B2
(45) Date of Patent: Jan. 21, 2020

(54) PROVIDING EFFICIENT HANDLING OF MEMORY ARRAY FAILURES IN PROCESSOR-BASED SYSTEMS

(71) Applicant: QUALCOMM Incorporated, San Diego, CA (US)

(72) Inventors: Thomas Philip Speier, Wake Forest, NC (US); Viren Ramesh Patel, Morrisville, NC (US); Michael Phan, Cary, NC (US); Manish Garg, Cary, NC (US); Kevin Magill, Durham, NC (US); Paul Steinmetz, Apex, NC (US); Clint Mumford, Apex, NC (US); Kshitiz Saxena, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 202 days.

(21) Appl. No.: 15/642,451

(22) Filed: Jul. 6, 2017

(65) Prior Publication Data
US 2018/0121274 A1 May 3, 2018

Related U.S. Application Data

(60) Provisional application No. 62/415,072, filed on Oct. 31, 2016.

(51) Int. Cl.
*G11C 29/44* (2006.01)
*G06F 11/07* (2006.01)
*G11C 29/00* (2006.01)

(52) U.S. Cl.
CPC ............ *G11C 29/44* (2013.01); *G06F 11/073* (2013.01); *G06F 11/0787* (2013.01); *G11C 29/883* (2013.01); *G11C 2029/4402* (2013.01)

(58) Field of Classification Search
CPC ..... G06F 11/073; G06F 11/0787; G06F 11/27; G11C 2029/0407; G11C 29/44;
(Continued)

(56) References Cited

U.S. PATENT DOCUMENTS 5,551,004 A * 8/1996 McClure ............. G06F 12/0888
711/129
6,006,311 A * 12/1999 Arimilli ............... G06F 12/126
365/200
(Continued)

OTHER PUBLICATIONS

International Search Report and Written Opinion for PCT/US2017/054285, dated Nov. 30, 2017, 13 pages.
(Continued)

*Primary Examiner* — Gabriel Chu
(74) *Attorney, Agent, or Firm* — Withrow & Terranova, PLLC

(57) ABSTRACT

Providing efficient handling of memory array failures in processor-based systems is disclosed. In this regard, in one aspect, a memory controller of a processor-based device is configured to detect a defect within a memory element of a plurality of memory elements of a memory array. In response, a disable register of one or more disable registers is set to correspond to the memory element to indicate that the memory element is disabled. The memory controller receives a memory access request to a memory address corresponding to the memory element, and determines, based on one or more disable registers, whether the memory element is disabled. If so, the memory controller disallows the memory access request. Some aspects may provide that the memory controller, in response to detecting the defect, provides a failure indication to an executing process, and subsequently receives, from the executing process, a request to set the disable register.

18 Claims, 5 Drawing Sheets

(58) Field of Classification Search
CPC .......... G11C 2029/4402; G11C 29/883; G11C 29/88; G11C 29/4401; G11C 29/70
See application file for complete search history.

(56) References Cited

U.S. PATENT DOCUMENTS

| | | | |
|---|---|---|---|
| 6,412,051 B1* | 6/2002 | Konigsburg | G06F 12/126 |
| | | | 711/128 |
| 6,847,565 B2 | 1/2005 | Abedifard et al. | |
| 7,340,582 B2 | 3/2008 | Madukkarumukumana et al. | |
| 7,509,543 B2 | 3/2009 | Mohr et al. | |
| 7,808,848 B2 | 10/2010 | Shibata et al. | |
| 9,401,226 B1 | 7/2016 | Shin et al. | |
| 9,466,393 B2 | 10/2016 | Kim et al. | |
| 9,633,706 B1* | 4/2017 | Kim | G11C 11/1657 |
| 2008/0031061 A1 | 2/2008 | Roohparvar | |
| 2008/0270703 A1 | 10/2008 | Henrion et al. | |
| 2010/0131812 A1 | 5/2010 | Mohammad | |
| 2014/0229769 A1 | 8/2014 | Abraham et al. | |

OTHER PUBLICATIONS

Second Written Opinion for PCT/US2017/054285, dated Oct. 2, 2018, 6 pages.
International Preliminary Report on Patentability for PCT/US2017/054285, dated Feb. 1, 2019, 21 pages.

* cited by examiner

PROVIDING EFFICIENT HANDLING OF MEMORY ARRAY FAILURES IN PROCESSOR-BASED SYSTEMS

PRIORITY CLAIM

The present application claims priority to U.S. Provisional Patent Application Ser. No. 62/415,072 filed on Oct. 31, 2016 and entitled "PROVIDING EFFICIENT HANDLING OF MEMORY ARRAY FAILURES IN PROCESSOR-BASED SYSTEMS," the contents of which is incorporated herein by reference in its entirety.

BACKGROUND

I. Field of the Disclosure

The technology of the disclosure relates generally to memory systems for processor-based systems, and, in particular, to handling defects and failures detected in memory arrays.

II. Background

Memory systems, such as cache memory, in conventional processor-based systems include memory arrays that are made up of individual memory elements, each of which represents a single block of data. In some aspects, memory elements are arranged into multiple interconnected rows and columns, thereby forming a memory array. Memory arrays tend to show a larger percentage of manufacturing defects and in-field failures as compared to other types of circuits. Thus, to increase manufacturing yield, it is necessary to provide mechanisms for preventing defects and failures within a memory array from causing a functional failure of the processor-based system of which the memory array is a part.

One mechanism for handling defects in a memory array involves providing redundant rows and/or redundant columns within the memory array. In this regard, FIG. 1 provides a simplified illustration of an exemplary processor-based system 100 that includes a central processing unit (CPU) 102 and a memory system 104. The memory system 104 provides a memory controller 106 and a memory array 108, which is made up of memory elements 110(0)-110(X). It is to be understood that the memory elements 110(0)-110(X) may be further subdivided into sets and ways as with conventional system caches, but such subdivisions are omitted from FIG. 1 for the sake of clarity. The memory array 108 further includes two (2) redundant rows 112(0), 112(1) made up of memory elements 114(0)-114(Y), 116(0)-116(Y). If a manufacturing defect or an in-field failure (such as a defect 118 in the memory element 110(0)) is detected by a design-for-test (DFT) application, the row containing the memory element 110(0) is physically disabled (e.g., by blowing a fuse), and the memory controller 106 uses one of the redundant rows 112(0), 112(1) in place of the row containing the memory element 110(0). Likewise, memory arrays may make use of redundant columns in addition to or instead of redundant rows such as the redundant rows 112(0), 112(1).

However, there are disadvantages associated with the use of redundancy mechanisms. Because it may not be possible to physically disable individual memory array rows or columns in the field, conventional redundancy mechanisms can be used only to correct defects that are detected by quality control processes during manufacturing of the memory array 108. Additional testing time may also be required, as built-in self-test (BIST) hardware that checks for defects may have to restart after each defect is detected. Redundant elements, such as the redundant rows 112(0), 112(1) also require extra control logic to be implemented by the memory controller 106, and require additional chip area within the processor-based system 100. Moreover, the control logic for providing row redundancy in particular may negatively impact memory array read access times, which could potentially limit the maximum frequency supported by the memory array 108. Thus, a mechanism for handling a wider variety of defects and failures in the memory array 108, while avoiding the performance and overhead penalties incurred by redundant elements, is desirable.

SUMMARY OF THE DISCLOSURE

Aspects disclosed in the detailed description include providing efficient handling of memory array failures in processor-based systems. In this regard, in one aspect, a memory system provides a memory controller that includes one or more disable registers that can be employed to logically disable one or more memory elements that are determined to be defective either by a manufacturing screen or by an in-field failure. Upon detection of a defect in a memory element, a disable register is updated to indicate that the memory element is disabled. As non-limiting examples, the disable register may be updated to store a memory address or other identifier for the memory element or for a memory subdivision (e.g., a set and/or way) of which the memory element is a part. In some aspects, the disable registers may be software-accessible to facilitate in-field repairs. Upon receiving a subsequent memory access request to a memory address corresponding to the memory element, the memory controller is configured to disallow the memory access request if a disabled register corresponding to the memory element indicates that the memory element is disabled. As non-limiting examples, the memory controller may cause a miss to result for a search operation on the memory address for the memory element, and/or may prevent a replacement algorithm from selecting the memory element. The memory controller may also prevent parity checks from being performed on the memory element, and/or may not perform cache maintenance operations on the memory element to prevent the memory element from being written. In aspects in which the memory controller cannot prevent read and/or search operations from being performed on the disabled memory element (e.g., due to not making a timing path), the memory controller may prevent the capture of data read from the disabled memory element in downstream pipeline registers to prevent any meta-stability condition.

In another aspect, a processor-based system for efficiently handling memory array failures is provided. The processor-based system includes a memory array providing a plurality of memory elements, and a memory controller including a plurality of disable registers. The memory controller is configured to detect a defect within a memory element of the plurality of memory elements of the memory array. The memory controller is further configured to, responsive to detecting the defect, set a disable register of the plurality of disable registers to indicate that the memory element is disabled. The memory controller is also configured to receive a memory access request to a memory address corresponding to the memory element. The memory controller is additionally configured to determine, based on the disable register, whether the memory element is disabled.

The memory controller is further configured to, responsive to determining that the memory element is disabled, disallow the memory access request.

In another aspect, a memory controller of a processor-based device is provided for efficiently handling memory array failures. The memory controller is configured to detect a defect within a memory element of a plurality of memory elements of a memory array. The memory controller is further configured to, responsive to detecting the defect, set a disable register, of one or more disable registers, to correspond to the memory element to indicate that the memory element is disabled. The memory controller is also configured to receive a memory access request to a memory address corresponding to the memory element. The memory controller is additionally configured to determine, based on the one or more disable registers, whether the memory element is disabled. The memory controller is further configured to, responsive to determining that the memory element is disabled, disallow the memory access request.

In another aspect, a memory controller of a processor-based device for efficiently handling memory array failures is provided. The memory controller comprises a means for detecting a defect within a memory element of a plurality of memory elements of a memory array. The memory controller further comprises a means for setting a disable register, of one or more disable registers, to correspond to the memory element to indicate that the memory element is disabled, responsive to detecting the defect. The memory controller also comprises a means for receiving a memory access request to a memory address corresponding to the memory element. The memory controller additionally comprises a means for determining, based on the one or more disable registers, whether the memory element is disabled. The memory controller further comprises a means for disallow the memory access request, responsive to determining that the memory element is disabled.

In another aspect, a method for efficiently handling memory array failures is provided. The method comprises detecting, by a memory controller of a processor-based device, a defect within a memory element of a plurality of memory elements of a memory array. The method further comprises, responsive to detecting the defect, setting a disable register, of one or more disable registers, to correspond to the memory element to indicate that the memory element is disabled. The method also comprises receiving a memory access request to a memory address corresponding to the memory element. The method additionally comprises determining, based on the one or more disable registers, whether the memory element is disabled. The method further comprises, responsive to determining that the memory element is disabled, disallowing the memory access request.

In another aspect, a non-transitory computer-readable medium is provided. The non-transitory computer-readable medium stores thereon computer-executable instructions which, when executed by a processor, cause the processor to detect a defect within a memory element of a plurality of memory elements of a memory array. The computer-executable instructions further cause the processor to, responsive to detecting the defect, set a disable register, of one or more disable registers, to correspond to the memory element to indicate that the memory element is disabled. The computer-executable instructions also cause the processor to receive a memory access request to a memory address corresponding to the memory element. The computer-executable instructions additionally cause the processor to determine, based on the one or more disable registers, whether the memory element is disabled. The computer-executable instructions further cause the processor to, responsive to determining that the memory element is disabled, disallow the memory access request.

DETAILED DESCRIPTION

Figure 1:
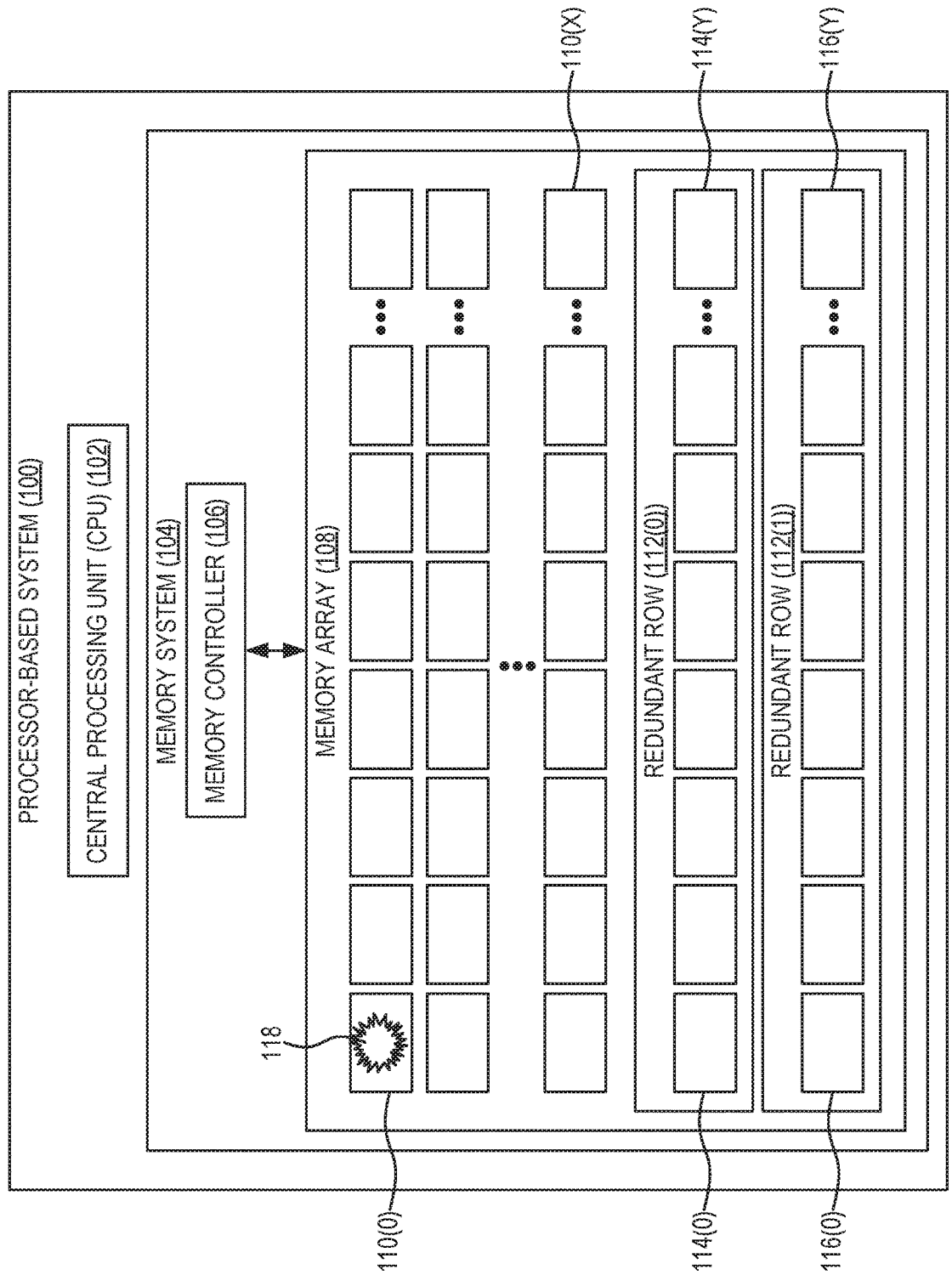
FIG. 1 is a block diagram of an exemplary processor-based system providing memory devices of different memory types.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include providing efficient handling of memory array failures in processor-based systems. As noted above with respect to FIG. 1, row- and/or column-level redundancy within memory arrays has been used in conventional processor-based devices to correct defects that arise during manufacturing. However, redundancy mechanisms require extra control logic and additional chip area, and may negatively impact memory array read access times.

Figure 2:
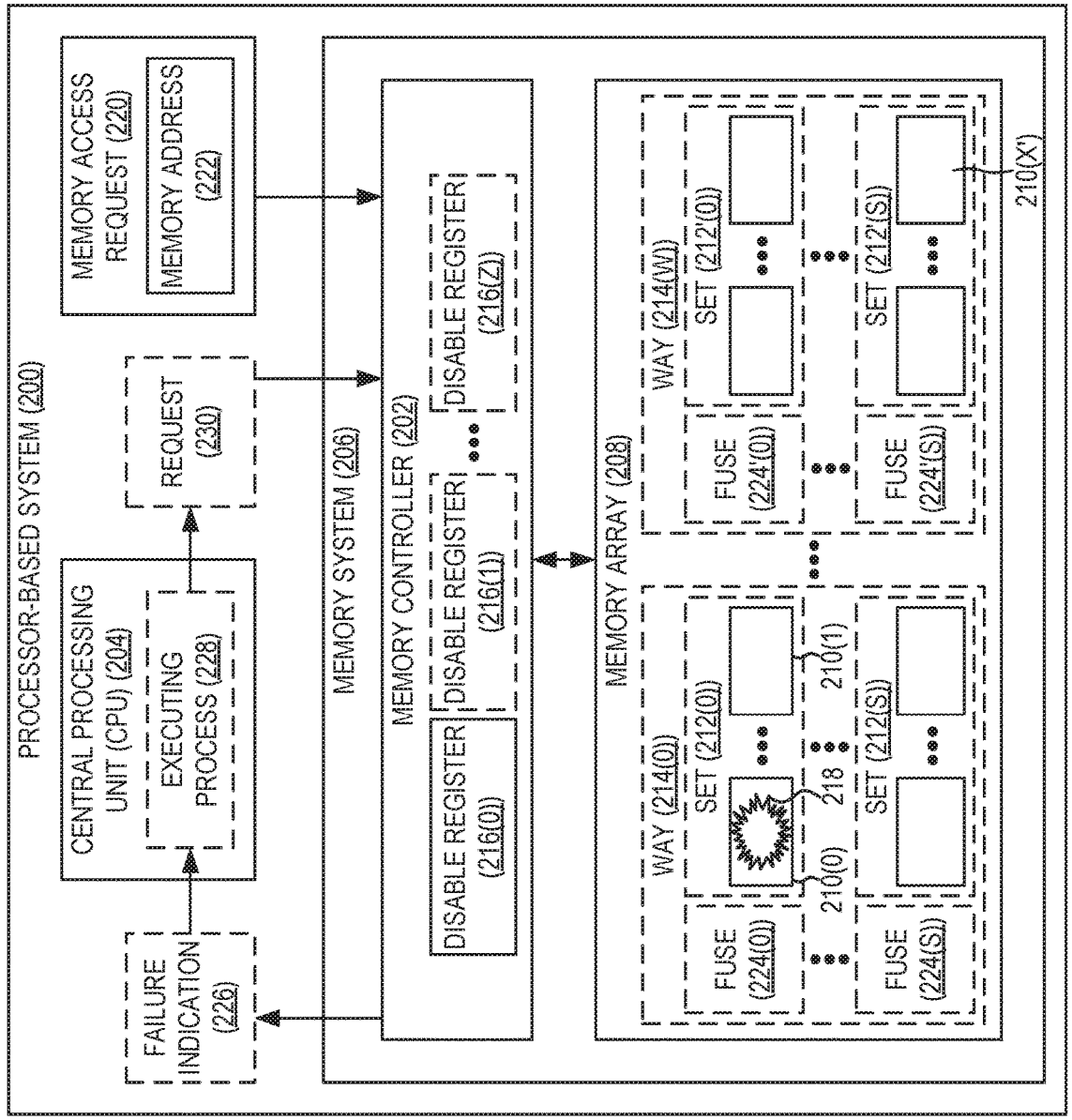
FIG. 2 is a block diagram of an exemplary processor-based system including a memory controller and memory devices configured to handle detected memory array failures.

Accordingly, in this regard, FIG. 2 illustrates an exemplary processor-based system 200 that includes a memory controller 202 for defect and failure handling. The processor-based system 200 provides a central processing unit (CPU) 204 and a memory system 206. In some aspects, the memory system 206 may be a synchronous dynamic random access memory (SDRAM) used as a system memory or a system cache, such as a Level 1 (L1), Level 2 (L2), or Level 3 (L3) cache. The memory system 206 includes the memory controller 202 and a memory array 208 that is made up of memory elements 210(0)-210(X') arranged in rows and columns. In the example of FIG. 2, the memory elements 210(0)-210(X') are organized into one or more sets 212(0)-212(S), 212'(0)-212'(S) and one or more ways 214(0), 214(W). However, some aspects may provide that the memory array 208 may be implemented in a configuration other than that illustrated in FIG. 2. In some aspects, the memory controller 202 may be implemented as a cache controller (not shown) provided as an integral element of the CPU 204, and the memory array 208 may comprise a cache (not shown) within the CPU 204. Additionally, the processor-based system 200 of FIG. 2 may encompass any one of known digital logic elements, semiconductor circuits, processing cores, and/or memory structures, among other elements, or combinations thereof. Aspects described herein are not restricted to any particular arrangement of elements, and the disclosed techniques may be easily extended to various structures and layouts on semiconductor dies or packages. It is to be understood that some aspects of the processor-based system 200 may include elements in addition to those illustrated in FIG. 2.

Instead of including redundant rows and/or redundant columns as in FIG. 1, the memory system 206 of FIG. 2 provides one or more disable registers 216(0)-216(Z) as part of the memory controller 202. The disable registers 216(0)-216(Z) in some aspects may be software-accessible, such that they may be read from and written to by software applications being executed by the CPU 204 to facilitate in-field repairs. In this manner, software may respond to failures in the memory array 208 detected at run-time by writing to an available disable register 216(0)-216(Z). The number Z of disable registers 216(0)-216(Z) in some aspects may be based on an anticipated number of repairs that may be required by the implementation of the memory array 208.

When a failure or defect, such as a defect 218 in the memory element 210(0), is detected, the memory controller 202 can set one of the disable registers 216(0)-216(Z) to indicate that the memory element 210(0) (or one of the subdivisions of the memory array 208 that includes the memory element 210(0), such as one of the sets 212(0)-212(S), 212'(0)-212'(S) and/or one of the ways 214(0), 214(W)) is disabled. For instance, one of the disable registers 216(0)-216(Z) may be updated to store a memory address or other identifier for the memory element 210(0), or may be updated to store an identifier of the set 212(0) and the way 214(0) containing the memory element 210(0). Note that if the corresponding memory subdivision contains multiple memory elements 210(0)-210(X'), the memory controller 202 ensures that a defect in any of the memory elements 210(0)-210(X') within the memory subdivision results in the same memory subdivision being disabled. As a non-limiting example, the memory controller 202 may disable the set 212(0) of the way 214(0) upon detecting the defect 218 in the memory element 210(0), and also may disable the set 212(0) of the way 214(0) if a defect (not shown) is detected the memory element 210(1).

In some aspects, the memory array 208 may be divided into multiple subsets, with the disable registers 216(0)-216(Z) also divided into multiple subsets corresponding to the subsets of the memory array 208. As a non-limiting example, the memory array 208 may be divided into two interleaved portions (not shown). Half of the disable registers 216(0)-216(Z) thus may be allocated for one interleaved portion of the memory array 208, while the remaining interleaved portion of the memory array 208 may correspond to the other half of the disable registers 216(0)-216(Z).

Upon receiving a subsequent memory access request 220 including a memory address 222 that corresponds to the memory element 210(0), the memory controller 202 is configured to disallow the memory access request 220. For example, the memory controller 202 may prevent software processes from reading from or writing to the disabled memory element 210(0) (or to a subdivision of the memory array 208 that includes the memory element 210(0), such as the set 212(0) of the way 214(0)). In aspects in which the memory system 206 is a system cache, the memory controller 202 may force a searching operation on the memory element 210(0) or its corresponding memory subdivision to result in a miss and/or may prevent a replacement algorithm from selecting the memory element 210(0), thus preventing the memory element 210(0) from being selected for allocation. The memory controller 202 may also disable parity error detection for the memory element 210(0) to prevent a parity check on the memory element 210(0), and/or may force the memory element 210(0) or its corresponding memory subdivision to be marked as invalid for purposes of a cleaning cache maintenance operation. Similarly, the memory controller 202 may prevent the memory element 210(0) or its corresponding memory subdivision from being written by an invalidating cache maintenance operation.

In some aspects, if any memory elements 210(0)-210(X') or memory subdivisions of the memory array 208 have been physically disabled, one or more of the disable registers 216(0)-216(Z) may be reset by the memory controller 202 at a power-on reset time to correspond to the disabled memory elements 210(0)-210(X') or memory subdivisions of the memory array 208. As a non-limiting example, in FIG. 2, each of the sets 212(0)-212(S), 212'(0)-212'(S) is associated with a corresponding fuse 224(0)-224(S), 224'(0)-224'(S), which may be "blown" to physically disable individual ones of the sets 212(0)-212(S), 212'(0)-212'(S). If one or more of the fuses 224(0)-224(S), 224'(0)-224'(S) is thus blown, the memory controller 202, after a power-on reset of the processor-based system 200, will reset one or more of the disable registers 216(0)-216(Z) based on the one or more of the fuses 224(0)-224(S), 224'(0)-224'(S). For instance, if the fuse 224(0) is blown, the memory controller 202 will reset two of the disable registers (e.g., the disable registers 216(0) and 216(1)) to indicate that the memory elements 210(0) and 210(1) are disabled, based on the fuse 224(0).

Some aspects employing the memory controller 202 may modify built-in self-test (BIST) hardware to take into account the mechanism for handling defects. For example, in aspects in which the disable registers 216(0)-216(Z) are used to disable a subdivision of the memory array 208 such as a set/way combination, the BIST hardware should understand that the entire subdivision of the memory array 208 is disabled. Thus, the BIST hardware should translate any defects in one of the memory elements 210(0)-210(X') into the corresponding subdivision. The BIST hardware should also prevent checking outputs for the corresponding subdivision of the memory array 208.

Some aspects may provide that the memory controller 202 is configured to set the disable registers 216(0)-216(Z) only after being instructed to do so by a process being executed by the CPU 204. In such aspects, after detecting the defect 218 in the memory element 210(0), the memory controller 202 may provide a failure indication 226 to an executing process 228. The memory controller 202 may subsequently receive a request 230 from the executing process 228 to set the disable register 216(0)-216(Z), after which the memory controller 202 will set the disable register 216(0)-216(Z). Such aspects may provide a greater degree of software-based control over the operations of the memory controller 202.

Figure 3:
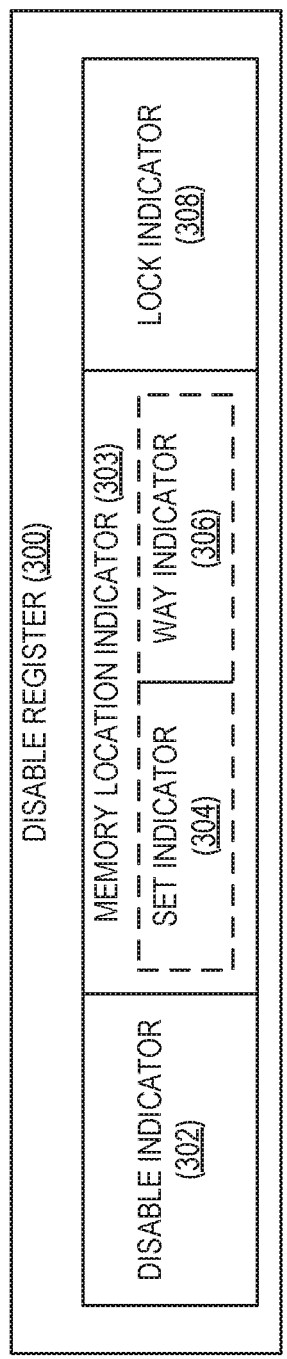
FIG. 3 is a block diagram illustrating exemplary constituent elements of disable registers of FIG. 2.

To illustrate exemplary constituent elements of the disable registers 216(0)-216(Z) of FIG. 2, FIG. 3 is provided. In FIG. 3, a disable register 300, corresponding to the disable registers 216(0)-216(Z) of FIG. 2, is shown, and may be used in conjunction with a cache memory. The disable register 300 of FIG. 3 includes four (4) fields: a disable indicator 302, a memory location indicator 303 (which, in some aspects, may include a set indicator 304 and a way indicator 306), and a lock indicator 308. The disable indicator 302 may include a bit that indicates whether the memory element (e.g., the memory element 210(0) in particular, or a subdivision of the memory array 208 such as the set 212(0) of the way 214(0)) of the memory array 208 is disabled. In some aspects, the disable indicator 302 may be set on a power-on reset of the associated power domain if the set/way is physically disabled (e.g., by having a fuse such as the fuse 224(0) blown due to a manufacturing defect). The memory location indicator 303 provides information identifying the location of the memory element 210(0) corresponding to the disable register 300. As a non-limiting example, some aspects may provide that the memory location indicator 303 includes the set indicator 304 to identify one of the sets 212(0)-212(S), 212'(0)-212'(S) of which the memory element 210(0) to be disabled is a member, as well as the way indicator 306 to specify one of the ways 214(0)-214(W) of which the memory element 210(0) to be disabled is a member. Finally, the lock indicator 308, when set, indicates that writes to the disable register 300 are blocked, regardless of the value of the disable indicator 302. The lock indicator 308 may be reset on a power-on reset of the associated power domain if the corresponding set/way subdivision of the memory array 208 is disabled. In this manner, software may be prevented from overriding a physically disabled set/way. It is to be understood that disable registers employed in other aspects may use more, fewer, or different fields than those illustrated for the disable register 300 of FIG. 3.

Figure 4:
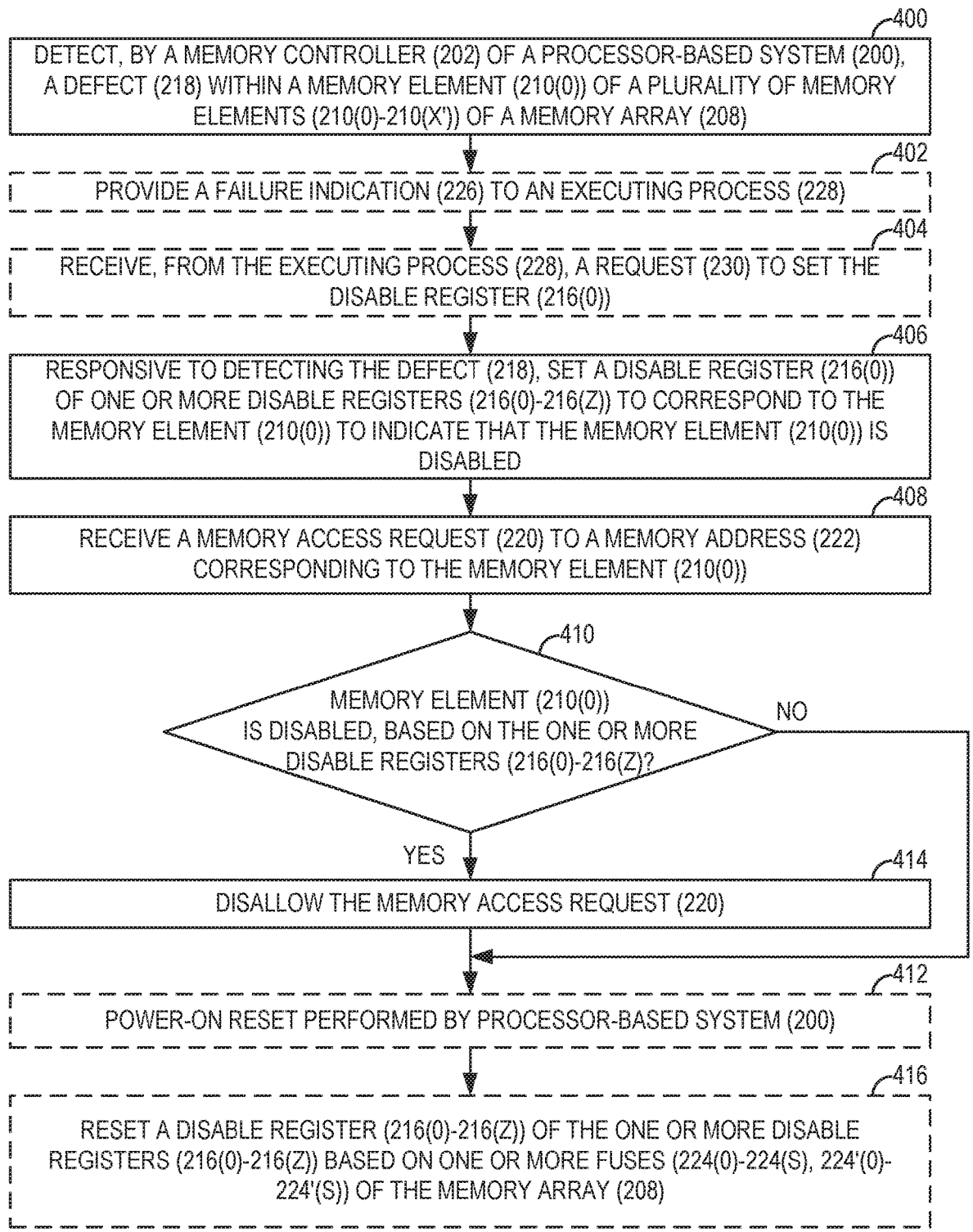
FIG. 4 is a flowchart illustrating an exemplary process for enabling efficient handling of memory array failures using disable registers of the memory controller of FIG. 2.

FIG. 4 illustrates exemplary operations of the memory controller 202 of FIG. 2 for providing efficient handling of memory array failures. For the sake of clarity, elements of FIG. 2 are referenced in describing FIG. 4. In FIG. 4, operations begin with the memory controller 202 detecting a defect 218 within a memory element 210(0) of the plurality of memory elements 210(0)-210(X') of the memory array 208 (block 400). In this regard, the memory controller 202 may be referred to herein as "a means for detecting a defect within a memory element of a plurality of memory elements of a memory array." In some aspects, the memory controller 202 may next provide a failure indication 226 to an executing process 228 (block 402). The memory controller 202 may then subsequently receive, from the executing process 228, a request 230 to set the disable register 216(0) (block 404).

In response to detecting the defect 218 (and, in aspects in which the failure indication 226 is provided to the executing process 228, receiving the request 230 to set the disable register 216(0)), the memory controller 202 sets the disable register 216(0) of the one or more disable registers 216(0)-216(Z) to correspond to the memory element 210(0) to indicate that the memory element 210(0) is disabled (block 406). Accordingly, the memory controller 202 may be referred to herein as "a means for setting a disable register, of one or more disable registers, to correspond to the memory element to indicate that the memory element is disabled, responsive to detecting the defect." The memory controller 202 subsequently receives a memory access request 220 to a memory address 222 corresponding to the memory element 210(0) (block 408). The memory controller 202 thus may be referred to herein as "a means for receiving a memory access request to a memory address corresponding to the memory element."

The memory controller 202 determines whether the memory element 210(0) is disabled, based on the one or more disable registers 216(0)-216(Y) (block 410). In this regard, the memory controller 202 may be referred to herein as "a means for determining, based on the one or more disable registers, whether the memory element is disabled." If the memory element 210(0) is determined not to be disabled, processing resumes at block 412. However, if the memory controller 202 determines at decision block 410 that the memory element 210(0) is disabled, the memory controller 202 disallows the memory access request 220 (block 414). Accordingly, the memory controller 202 may be referred to herein as "a means for disallow the memory access request, responsive to determining that the memory element is disabled."

In some aspects, the processor-based system 200 may perform a power-on reset (block 412). Upon restarting, the memory controller 202 resets a disable register 216(0)-216(Y) of the one or more disable registers 216(0)-216(Y) based on one or more fuses 224(0)-224(S), 224'(0)-224'(S) of the memory array 208 (block 416).

Providing efficient handling of memory array failures in processor-based systems according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 5:
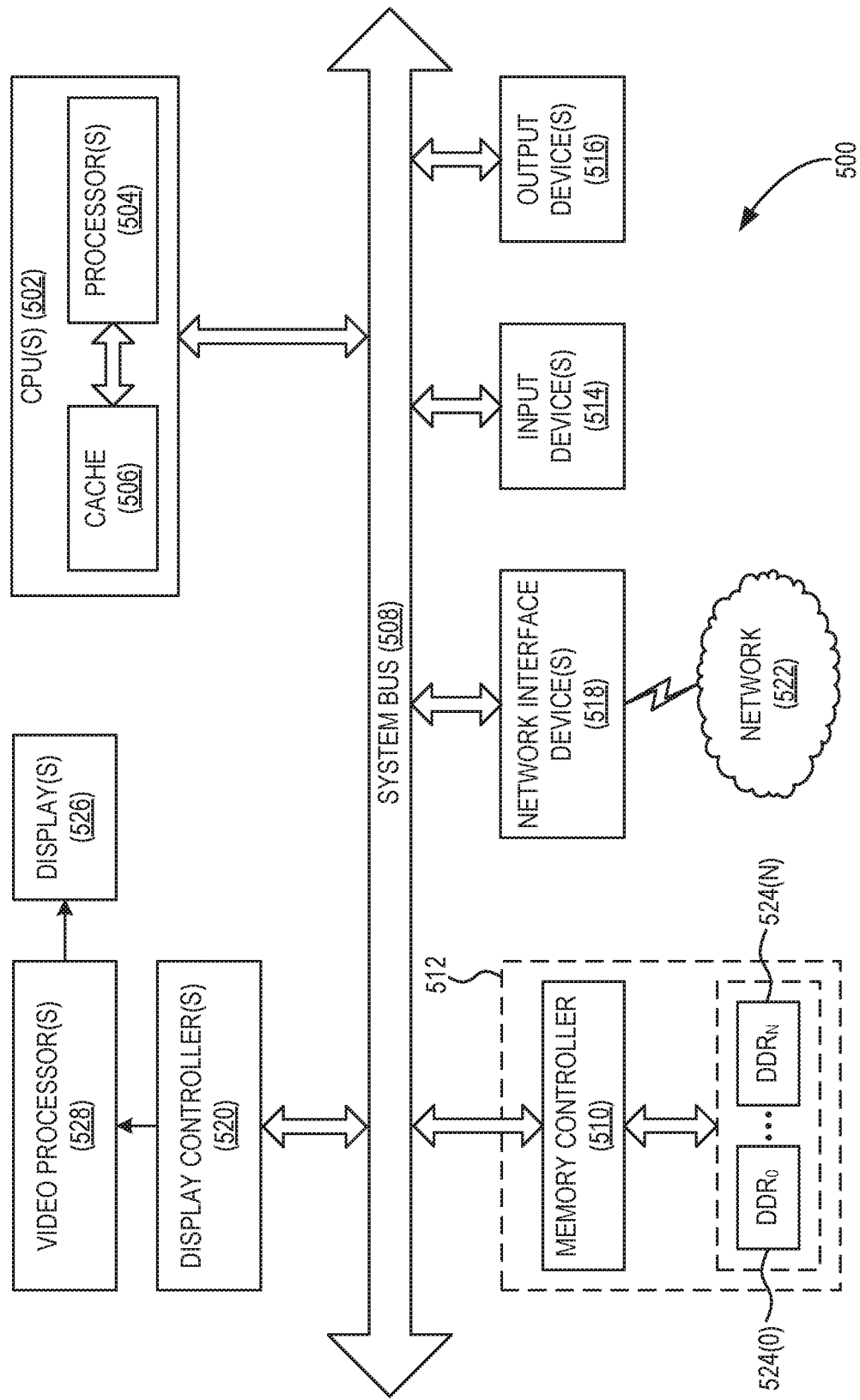
FIG. 5 is a block diagram of an exemplary processor-based system that can include the memory controller of FIG. 2.

In this regard, FIG. 5 illustrates an example of a processor-based system 500 that can employ the memory controller 202 and the disable registers 216(0)-216(Z) illustrated in FIG. 2. The processor-based system 500 includes one or more CPUs 502, each including one or more processors 504. The CPU(s) 502 may have cache memory 506 coupled to the processor(s) 504 for rapid access to temporarily stored data, and in some aspects may correspond to the CPU 204 of FIG. 2. The CPU(s) 502 is coupled to a system bus 508 and can intercouple master and slave devices included in the processor-based system 500. As is well known, the CPU(s) 502 communicates with these other devices by exchanging address, control, and data information over the system bus 508. For example, the CPU(s) 502 can communicate bus transaction requests to a memory controller 510 as an example of a slave device. According to some aspects, the memory controller 510 may correspond to the memory controller 202 of FIG. 2.

Other master and slave devices can be connected to the system bus 508. As illustrated in FIG. 5, these devices can include a memory system 512, one or more input devices 514, one or more output devices 516, one or more network interface devices 518, and one or more display controllers 520, as examples. In some aspects, the memory system 512 may correspond to the memory system 206 of FIG. 2. The input device(s) 514 can include any type of input device, including but not limited to input keys, switches, voice processors, etc. The output device(s) 516 can include any type of output device, including, but not limited to, audio, video, other visual indicators, etc. The network interface device(s) 518 can be any devices configured to allow exchange of data to and from a network 522. The network 522 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 518 can be configured to support any type of communications protocol desired. The memory system 512 can include one or more memory units 524(0)-524(N).

The CPU(s) 502 may also be configured to access the display controller(s) 520 over the system bus 508 to control information sent to one or more displays 526. The display controller(s) 520 sends information to the display(s) 526 to be displayed via one or more video processors 528, which process the information to be displayed into a format suitable for the display(s) 526. The display(s) 526 can include any type of display, including, but not limited to, a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory controller of a processor-based device for efficiently handling memory array failures, configured to:
   detect a defect within a memory element of a plurality of memory elements of a memory array;
   responsive to detecting the defect, set a disable register, of one or more disable registers, to correspond to the memory element to indicate that the memory element is disabled, wherein each disable register of the one or more disable registers comprises a memory location indicator to identify a location of the memory element corresponding to the disable register;
   receive a memory access request to a memory address corresponding to the memory element;
   determine, based on the one or more disable registers, whether the memory element is disabled; and
   responsive to determining that the memory element is disabled, disallow the memory access request;
   wherein the memory controller is configured to disallow the memory access request by being configured to perform one or more of:
      forcing a searching operation on the memory element to result in a miss;
      preventing a replacement algorithm from selecting the memory element;
      preventing a parity check on the memory element;
      forcing the memory element to be marked invalid during a cleaning cache maintenance operation; and
      preventing the memory element from being written by an invalidating cache maintenance operation.

2. The memory controller of claim 1, further configured to:
   responsive to detecting the defect and prior to setting the disable register, provide a failure indication to an executing process; and
   receive, from the executing process, a request to set the disable register;

wherein the memory controller is configured to set the disable register of the one or more disable registers to correspond to the memory element to indicate that the memory element is disabled further responsive to receiving the request to set the disable register.

3. The memory controller of claim 1, wherein:
the memory array comprises a system cache; and
each memory element of the plurality of memory elements corresponds to one set of one or more sets of the system cache and one way of one or more ways of the system cache.

4. The memory controller of claim 3, wherein each disable register of the one or more disable registers comprises:
a disable indicator configured to indicate whether the memory element corresponding to the disable register is disabled;
a memory location indicator to identify a location of the memory element corresponding to the disable register; and
a lock indicator configured to indicate whether writes to the disable register are blocked.

5. The memory controller of claim 1, further configured to, subsequent to a power-on reset of the processor-based device, reset a disable register of the one or more disable registers based on one or more fuses of the memory array.

6. The memory controller of claim 1, wherein:
the memory array is subdivided into a plurality of subsets; and
the one or more disable registers are subdivided into a plurality of subsets corresponding to the plurality of subsets of the memory array.

7. The memory controller of claim 1 integrated into an integrated circuit (IC).

8. The memory controller of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. A memory controller of a processor-based device for efficiently handling memory array failures, comprising:
a means for detecting a defect within a memory element of a plurality of memory elements of a memory array;
a means for setting a disable register, of one or more disable registers, to correspond to the memory element to indicate that the memory element is disabled, responsive to detecting the defect, wherein each disable register of the one or more disable registers comprises a memory location indicator to identify a location of the memory element corresponding to the disable register;
a means for receiving a memory access request to a memory address corresponding to the memory element;
a means for determining, based on the one or more disable registers, whether the memory element is disabled; and
a means for disallowing the memory access request, responsive to determining that the memory element is disabled;
wherein the means for disallowing the memory access request comprises one or more of:
a means for forcing a searching operation on the memory element to result in a miss;
a means for preventing a replacement algorithm from selecting the memory element;
a means for preventing a parity check on the memory element;
a means for forcing the memory element to be marked invalid during a cleaning cache maintenance operation; and
a means for preventing the memory element from being written by an invalidating cache maintenance operation.

10. A method for efficiently handling memory array failures, comprising:
detecting, by a memory controller of a processor-based device, a defect within a memory element of a plurality of memory elements of a memory array;
responsive to detecting the defect, setting a disable register, of one or more disable registers, to correspond to the memory element to indicate that the memory element is disabled, wherein each disable register of the one or more disable registers comprises a memory location indicator to identify a location of the memory element corresponding to the disable register;
receiving a memory access request to a memory address corresponding to the memory element;
determining, based on the one or more disable registers, whether the memory element is disabled; and
responsive to determining that the memory element is disabled, disallowing the memory access request;
wherein disallowing the memory access request comprises one or more of:
forcing a searching operation on the memory element to result in a miss;
preventing a replacement algorithm from selecting the memory element;
preventing a parity check on the memory element;
forcing the memory element to be marked invalid during a cleaning cache maintenance operation; and
preventing the memory element from being written by an invalidating cache maintenance operation.

11. The method of claim 10, further comprising:
responsive to detecting the defect and prior to setting the disable register, providing a failure indication to an executing process; and
receiving, from the executing process, a request to set the disable register;
wherein setting the disable register of the one or more disable registers to correspond to the memory element to indicate that the memory element is disabled is further responsive to receiving the request to set the disable register.

12. The method of claim 10, wherein:
the memory array comprises a system cache; and
each memory element of the plurality of memory elements corresponds to one set of one or more sets of the system cache and one way of one or more ways of the system cache.

13. The method of claim 12, wherein each disable register of the one or more disable registers comprises:

a disable indicator configured to indicate whether the memory element corresponding to the disable register is disabled;

a memory location indicator to identify a location of the memory element corresponding to the disable register; and a lock indicator configured to indicate whether writes to the disable register are blocked.

14. The method of claim 10, further comprising, subsequent to a power-on reset of the processor-based device, resetting a disable register of the one or more disable registers based on one or more fuses of the memory array.

15. The method of claim 10, wherein:
the memory array is subdivided into a plurality of subsets; and
the one or more disable registers are subdivided into a plurality of subsets corresponding to the plurality of subsets of the memory array.

16. A non-transitory computer-readable medium having stored thereon computer-executable instructions which, when executed by a processor, cause the processor to:

detect a defect within a memory element of a plurality of memory elements of a memory array;

responsive to detecting the defect, set a disable register, of one or more disable registers, to correspond to the memory element to indicate that the memory element is disabled, wherein each disable register of the one or more disable registers comprises a memory location indicator to identify a location of the memory element corresponding to the disable register;

receive a memory access request to a memory address corresponding to the memory element;

determine, based on the one or more disable registers, whether the memory element is disabled; and responsive to determining that the memory element is disabled, disallow the memory access request by performing one or more of:
 forcing a searching operation on the memory element to result in a miss;
 preventing a replacement algorithm from selecting the memory element;
 preventing a parity check on the memory element;
 forcing the memory element to be marked invalid during a cleaning cache maintenance operation; and
 preventing the memory element from being written by an invalidating cache maintenance operation.

17. The non-transitory computer-readable medium of claim 16 having stored thereon computer-executable instructions which, when executed by a processor, further cause the processor to:

responsive to detecting the defect and prior to setting the disable register, provide a failure indication to an executing process; and receive, from the executing process, a request to set the disable register;

wherein the computer-executable instructions cause the processor to set the disable register of the one or more disable registers to correspond to the memory element to indicate that the memory element is disabled further responsive to receiving the request to set the disable register.

18. The non-transitory computer-readable medium of claim 16 having stored thereon computer-executable instructions which, when executed by a processor, further cause the processor to, subsequent to a power-on reset of the processor, reset a disable register of the one or more disable registers based on one or more fuses of the memory array.

* * * * *